(12) United States Patent
Joseph et al.

(10) Patent No.: US 12,426,320 B2
(45) Date of Patent: Sep. 23, 2025

(54) VERTICALLY STACKED FIN SEMICONDUCTOR DEVICES

(71) Applicant: INTERNATIONAL BUSINESS MACHINES CORPORATION, Armonk, NY (US)

(72) Inventors: Praveen Joseph, White Plains, NY (US); Tao Li, Albany, NY (US); Indira Seshadri, Niskayuna, NY (US); Ekmini A. De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 430 days.

(21) Appl. No.: 17/343,291

(22) Filed: Jun. 9, 2021

(65) Prior Publication Data
US 2021/0296438 A1 Sep. 23, 2021

Related U.S. Application Data

(62) Division of application No. 16/397,452, filed on Apr. 29, 2019, now Pat. No. 11,075,266.

(51) Int. Cl.
*H10D 62/10* (2025.01)
*H01L 21/02* (2006.01)
(Continued)

(52) U.S. Cl.
CPC ..... *H10D 62/115* (2025.01); *H01L 21/02164* (2013.01); *H01L 21/0217* (2013.01);
(Continued)

(58) Field of Classification Search
CPC ......... H01L 21/02123; H01L 21/02164; H01L 21/0217; H01L 21/02225; H01L 21/02238;
(Continued)

(56) References Cited

U.S. PATENT DOCUMENTS 7,368,788 B2 * 5/2008 Huo ................. H01L 21/84
257/350
9,343,152 B2 5/2016 Rhie
(Continued)

FOREIGN PATENT DOCUMENTS

CN 108695321 A 10/2018
JP 2015-073095 A 4/2015
(Continued)

OTHER PUBLICATIONS

List of IBM Patents or Patent Applications Treated as Related dated Jun. 9, 2021, 2 pages.
(Continued)

*Primary Examiner* — Marcos D. Pizarro
(74) *Attorney, Agent, or Firm* — Tutunjian & Bitetto, P.C.; Joseph P. Curcura

(57) ABSTRACT

Semiconductor devices and methods of forming the same include forming a first dielectric layer around a semiconductor fin, formed from a first dielectric material, to a target height lower than a height of the semiconductor fin. A second dielectric layer is deposited on the first dielectric layer and is formed from a second dielectric material. A third dielectric layer, formed from the first dielectric material, is formed on the second dielectric layer. The second dielectric layer is etched away to expose a gap on the semiconductor fin. A portion of the semiconductor fin that is exposed in the gap is oxidized to form an isolation layer.

5 Claims, 6 Drawing Sheets

(51) Int. Cl.
*H01L 21/306* (2006.01)
*H01L 21/3065* (2006.01)
*H01L 21/311* (2006.01)
*H01L 21/762* (2006.01)
*H10D 30/01* (2025.01)
*H10D 30/62* (2025.01)
*H10D 84/01* (2025.01)
*H10D 84/03* (2025.01)
*H10D 84/85* (2025.01)

(52) U.S. Cl.
CPC .. *H01L 21/02225* (2013.01); *H01L 21/02238* (2013.01); *H01L 21/02252* (2013.01); *H01L 21/02381* (2013.01); *H01L 21/30604* (2013.01); *H01L 21/3065* (2013.01); *H01L 21/31116* (2013.01); *H01L 21/7624* (2013.01); *H10D 30/024* (2025.01); *H10D 30/6211* (2025.01); *H10D 84/0188* (2025.01); *H10D 84/0193* (2025.01); *H10D 84/038* (2025.01); *H10D 84/853* (2025.01)

(58) Field of Classification Search
CPC ............. H01L 21/02252; H01L 21/762; H01L 21/7624; H01L 21/823431; H01L 21/823481; H01L 29/0649; H01L 29/66795; H01L 29/785; H01L 29/7851; H01L 21/02381; H01L 21/30604; H01L 21/3065; H10D 30/024; H10D 30/6211; H10D 62/115
See application file for complete search history.

(56) References Cited

U.S. PATENT DOCUMENTS

| | | | |
|---|---|---|---|
| 10,109,721 | B2 | 10/2018 | Lin et al. |
| 10,181,526 | B2 | 1/2019 | Cantoro et al. |
| 10,559,684 | B2 | 2/2020 | Shen et al. |
| 10,930,761 | B2 | 2/2021 | Masuoka et al. |
| 2010/0163971 | A1 | 7/2010 | Hung et al. |
| 2012/0126883 | A1 | 5/2012 | Juengling |
| 2014/0106574 | A1 | 4/2014 | Kang et al. |
| 2015/0102409 | A1 | 4/2015 | Cheng et al. |
| 2015/0162436 | A1* | 6/2015 | Toh ................. H01L 29/7851 438/283 |
| 2015/0214239 | A1 | 7/2015 | Rhie |
| 2015/0217330 | A1 | 8/2015 | Haukka et al. |
| 2015/0372119 | A1 | 12/2015 | Zhang et al. |
| 2016/0233315 | A1* | 8/2016 | Cheng .............. H01L 21/31051 |
| 2017/0114459 | A1 | 4/2017 | Saly et al. |
| 2017/0140996 | A1 | 5/2017 | Lin et al. |
| 2017/0148629 | A1* | 5/2017 | Cheng ................ H01L 27/0924 |
| 2017/0342553 | A1 | 11/2017 | Yu et al. |
| 2018/0012752 | A1 | 1/2018 | Tapily |
| 2018/0138268 | A1 | 5/2018 | Smith et al. |
| 2018/0277442 | A1 | 9/2018 | Leobandung |

FOREIGN PATENT DOCUMENTS

| | | |
|---|---|---|
| JP | WO 2018 033981 A1 | 8/2018 |
| KR | 20170078186 A | 7/2017 |
| WO | 2010/016008 | 2/2010 |
| WO | 2018211341 A | 11/2018 |
| WO | 2019060413 A1 | 3/2019 |

OTHER PUBLICATIONS

Elizabeth Buitrago et al., "The top-down fabrication of a 3D-integrated, fully CMOS-compatible FET biosensor based on vertically stacked SINWs and FinFETs", Sensors and Actuators B 193 (Mar. 2014) 400-412.

Eugene A. Irene et al., "Silicon Oxidation Studies: Silicon Orientation Effects on Thermal Oxidation", J. Electrochem. Soc., Jun. 1986.

Darsen Lu et al., "Dielectric Isolated FinFETs on Bulk Substrate", 2014 SOI-3D-Subthreshold Microelectronics Technology Unified Conference (S3S), Millbrae, CA, Oct. 2014.

Sonam D. Sherpa et al., "Quasi-atomic layer etching of silicon nitride", J. Vac. Sci. Technol. A 35(1), (Jan./Feb. 2017).

The State Intellectual Property Office of People's Republic of China, "First Office Action", Mar. 1, 2025, 06 Pages, CN Application No. 202080031546.7.

Notice of Reasons for Refusal issued in corresponding Japanese Patent Application No. 2021-563597 dated Oct. 17, 2023, 3 pgs.

* cited by examiner

VERTICALLY STACKED FIN SEMICONDUCTOR DEVICES

BACKGROUND

The present invention generally relates to semiconductor devices and, more particularly, to the formation of stacked semiconductor devices having varying isolation heights and thicknesses.

By stacking semiconductor fin structures on top of one another, the density of devices per unit area can be increased substantially. This structure is particularly useful for devices where a first device type is stacked on another device type, for example stacking p-type field effect transistors (FETs) and n-type FETs. However, current processes for achieving this often use silicon-on-insulator wafers, with the insulator forming an isolation layer between pairs of fins. This process makes it challenging to vary the devices in different parts of the chip, for example having the isolation layer at differing heights and differing thicknesses.

SUMMARY

A method of forming a semiconductor device includes forming a first dielectric layer around a semiconductor fin, formed from a first dielectric material, to a target height lower than a height of the semiconductor fin. A second dielectric layer is deposited on the first dielectric layer and is formed from a second dielectric material. A third dielectric layer, formed from the first dielectric material, is formed on the second dielectric layer. The second dielectric layer is etched away to expose a gap on the semiconductor fin. A portion of the semiconductor fin that is exposed in the gap is oxidized to form an isolation layer.

A method of forming semiconductor devices includes forming a first dielectric layer around a first semiconductor fin in a first device region, formed from a first dielectric material, to a first target height lower than a height of the first semiconductor fin. A second dielectric layer is deposited on the first dielectric layer, formed from a second dielectric material. A third dielectric layer, formed from the first dielectric material, is formed on the second dielectric layer. The second dielectric layer is etched away to expose a gap on the first semiconductor fin. A portion of the semiconductor fin, exposed in the gap on the first semiconductor fin, is oxidized to form a first isolation layer having a first vertical thickness. A fourth dielectric layer is formed around a second semiconductor fin in a second device region, formed from the first dielectric material, to a second target height lower than a height of the second semiconductor fin. A fifth dielectric layer is deposited on the fourth dielectric layer, formed from the second dielectric material. A sixth dielectric layer is formed on the fifth dielectric layer, formed from the first dielectric material. The fifth dielectric layer is etched away to expose a gap on the second semiconductor fin. A portion of the second semiconductor fin, exposed in the gap on the second semiconductor fin, is oxidized to form a second isolation layer having a second vertical thickness.

An integrated circuit includes a first stacked-fin semiconductor device and a second stacked-fin semiconductor device. The first stacked-fin semiconductor device includes a first bottom fin having a first bottom fin height, a first top fin having a first top fin height, and a first isolation layer, between the first bottom fin and the first top fin, having a first isolation layer vertical thickness. The second stacked-fin semiconductor device includes a second bottom fin having a second bottom fin height, a second top fin having a second top fin height, and a second isolation layer, between the second bottom fin and the second top fin, having a second isolation layer vertical thickness. The top fin height, the bottom fin height, and isolation layer vertical thickness differ between the first stacked-fin semiconductor device and the second stacked-fin semiconductor device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide fabrication of stacked semiconductor fin devices with the ability to control a height and thickness of the isolation layer between pairs of fins. The present embodiments can thereby create transistor devices, such as vertical field effect transistors (VFETs), with varying properties, such as differing channel lengths. In particular different devices can have different proportions between the heights of their top and bottom fins, with the size of the isolation layer also being controllable.

To accomplish this, a dielectric layer is formed that partially fills a space around a fin, with a height of the fill defining the height of the isolation layer. This dielectric can be formed by a fill that rises to the height or by overfilling and then etching back. Different regions of the chip can be masked and then subsequently formed with an isolation layer having different properties using the same fabrication process. As a result, the top fin and bottom fin of a stacked pair of semiconductor fins can be formed with different heights. Additionally, the isolation layer can be adjusted in height by setting oxidation parameters, causing more or less of the top and bottom stacked semiconductor fins to be converted to a dielectric material.

Figure 1:
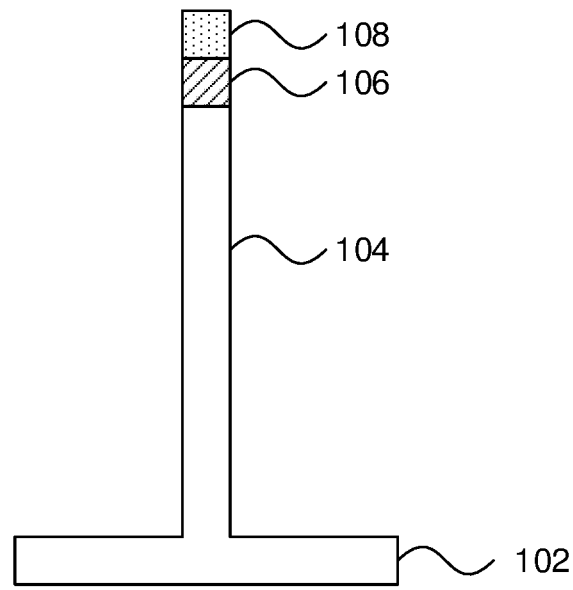
FIG. 1 is a cross-sectional diagram of a step in the formation of a semiconductor device having stacked top and bottom semiconductor fins at controllable respective heights, separated by an isolation layer of controllable thickness, in accordance with an embodiment of the present invention.

Referring now to FIG. 1, a cross-sectional diagram of a step in the formation of stacked fin devices with varying fin lengths and isolation thickness is shown. A semiconductor fin 104 is formed on a semiconductor substrate 102 by any appropriate anisotropic etch process, such as a reactive ion etch (RIE) process. In various embodiments, the vertical fin can be formed by an image transfer process, for example, a sidewall image transfer (SIT), also referred to as Self-Aligned Double Patterning (SADP), a Self-aligned triple patterning (SATP) process, a Self-Aligned Quadruple Patterning (SAQP) process, or a combination thereof. In various embodiments, the vertical fins can be formed by a direct-write process, for example, using extreme ultraviolet (EUV) lithography, electron beam lithography, or x-ray lithography. In the embodiment shown, a mask that includes a first dielectric 106 formed from, e.g., silicon nitride, and a second dielectric 108 formed from an oxide such as, e.g., silicon dioxide.

Although the present description depicts a semiconductor fin 104 that is integrally formed from a semiconductor substrate 102, it should be understood that the materials of the semiconductor fin 104 and the semiconductor substrate 102 can differ. For example, the material of the semiconductor fin 104 can be epitaxially grown from the semiconductor substrate 102 or otherwise formed thereon.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, epitaxial silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The semiconductor fin 104 can therefore also be formed from a silicon-containing material or any other appropriate semiconductor material.

RIE is a form of plasma etching in which, during etching, the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface.

Although only a single fin is shown, it should be understood that the present embodiments can be employed in multiple different device regions on a single wafer or chip with multiple different respective fins. The different regions represent devices that will have different characteristics as a result of having different size proportions between top and bottom fins. Other variations between the regions can include differing work-function materials, differing dielectric materials, differing fin shapes/sizes/orientations, etc. As will be described in greater detail below, particular regions can be covered with a masking layer to protect them while other regions are being processed.

Figure 2:
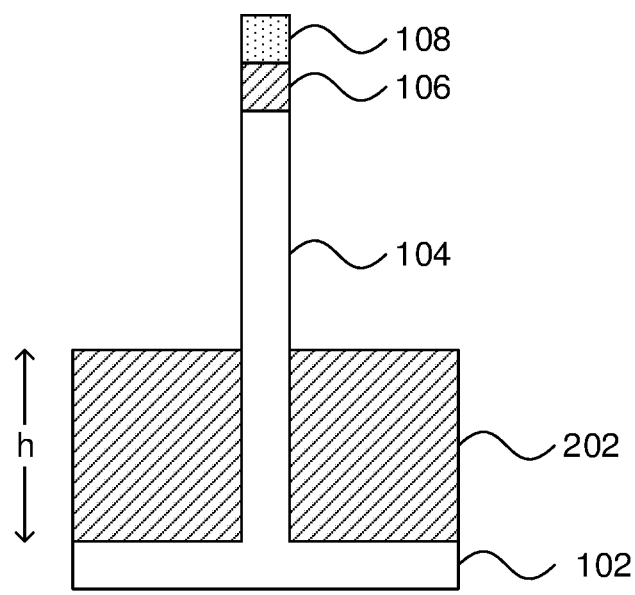
FIG. 2 is a cross-sectional diagram of a step in the formation of a semiconductor device having stacked top and bottom semiconductor fins at controllable respective heights, separated by an isolation layer of controllable thickness, in accordance with an embodiment of the present invention.

Referring now to FIG. 2, a cross-sectional diagram of a step in the formation of stacked fin devices with varying fin lengths and isolation thickness is shown. A layer of dielectric material 202 is formed around the fin 104. The dielectric layer 202 can be formed in some embodiments by depositing a dielectric material, such as silicon nitride, up to a particular height h. In some embodiments, a timed directional deposition can be used to deposit the dielectric material up to the height h. In other embodiments, a directional deposition, such as gas cluster ion beam deposition, can be used. In yet other embodiments, the surface of the oxide material 108 can be chemically treated to inhibit accumulation of the dielectric material on it, while deposition on the substrate 102 is not inhibited. The height h can then be determined by the number of deposition cycles.

In other embodiments, the dielectric layer 202 can be formed by filling the dielectric material to a height above that of the fins and then anisotropically etching the dielectric material back to the height h using, e.g., an RIE.

The dielectric material can be deposited using any appropriate process, including chemical vapor deposition (CVD), atomic layer deposition (ALD), physical vapor deposition (PVD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
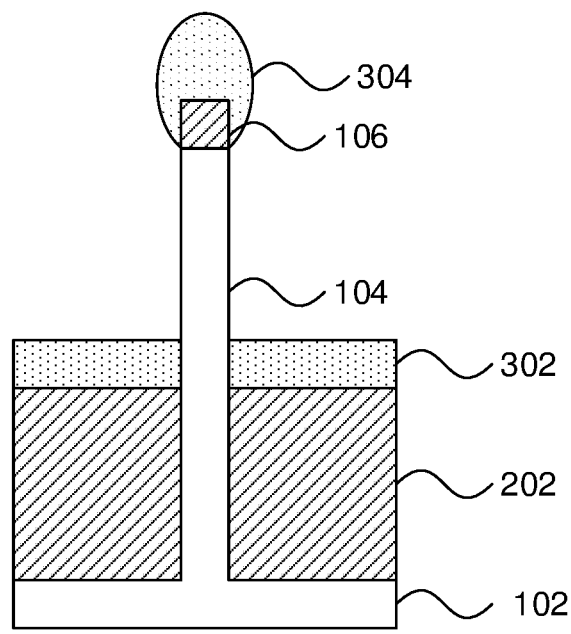
FIG. 3 is a cross-sectional diagram of a step in the formation of a semiconductor device having stacked top and bottom semiconductor fins at controllable respective heights, separated by an isolation layer of controllable thickness, in accordance with an embodiment of the present invention.

Referring now to FIG. 3, a cross-sectional diagram of a step in the formation of stacked fin devices with varying fin lengths and isolation thicknesses is shown. An oxide material is deposited. The exposed surfaces of the semiconductor fins 104 are treated to prevent accumulation of the oxide material on the sidewalls of the fins 104. In some embodiments, the fin surfaces can be treated using an alkyne functionalized organic layer. This leaves silicon nitride surfaces available for oxide deposition using any appropriate conformal deposition process. The result is a horizontal oxide layer 302 on the top surface of the dielectric layer 202 and an oxide cap 304 formed at the top of the nitride material 106. As noted above, the oxide material may be any appropriate oxide material, such as silicon dioxide.

Figure 4:
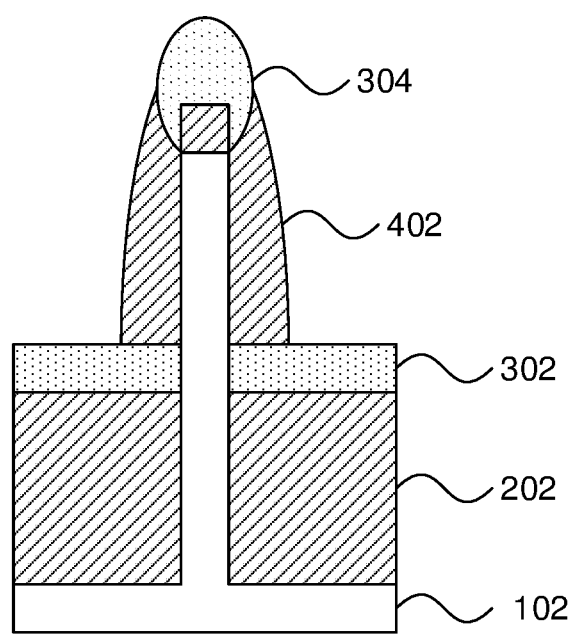
FIG. 4 is a cross-sectional diagram of a step in the formation of a semiconductor device having stacked top and bottom semiconductor fins at controllable respective heights, separated by an isolation layer of controllable thickness, in accordance with an embodiment of the present invention.

Referring now to FIG. 4, a cross-sectional diagram of a step in the formation of stacked fin devices with varying fin lengths and isolation thickness is shown. A layer of dielectric material, such as silicon nitride, is conformally deposited using any appropriate deposition process, and is then removed from horizontal surfaces using an anisotropic etch, such as an RIE using $CF_4/CHF_3$. This produces sidewall structures 402, with top portions that are formed on the lower parts of the oxide cap 304. The portions of the sidewall structures 402 that are protected from the anisotropic etch by the oxide cap 304 remain.

Figure 5:
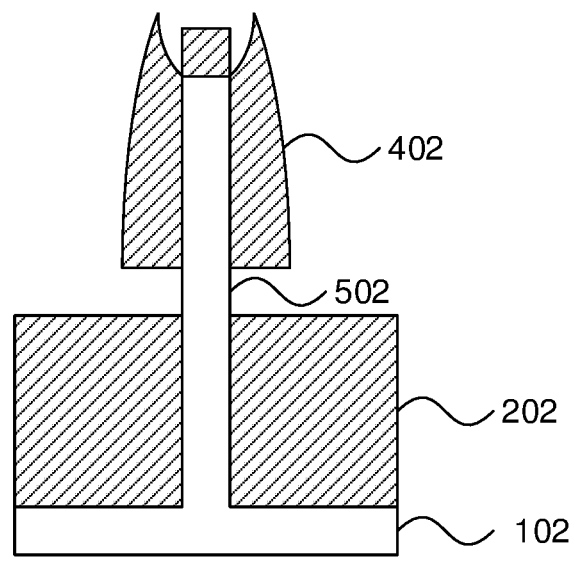
FIG. 5 is a cross-sectional diagram of a step in the formation of a semiconductor device having stacked top and bottom semiconductor fins at controllable respective heights, separated by an isolation layer of controllable thickness, in accordance with an embodiment of the present invention.

Referring now to FIG. 5, a cross-sectional diagram of a step in the formation of stacked fin devices with varying fin lengths and isolation thickness is shown. The oxide portions are etched away using an isotropic etch such as, e.g., a buffered hydrofluoric wet etch. This isotropic etch undercuts the sidewall structures 402 and exposes a portion 502 in the middle of the semiconductor fin 104. The height of this portion 502 above the substrate 102 is determined by the height of the dielectric layer 202. The vertical thickness of the portion 502 is determined by the thickness of the horizontal oxide layer 302.

The etch of the oxide portions 302 and 304 is performed using a selective etch that preferentially removes the oxide material relative to the dielectric material of the dielectric layer 202 and the sidewalls 402, leaving these structures relatively undamaged. As used herein, the term "selective" in reference to a material removal process denotes that the rate of material removal for a first material is greater than the rate of removal for at least another material of the structure to which the material removal process is being applied. Thus, the oxide portions 302 and 304 are removed without substantially damaging the material of the dielectric layer 202, which is formed from a different material.

Figure 6:
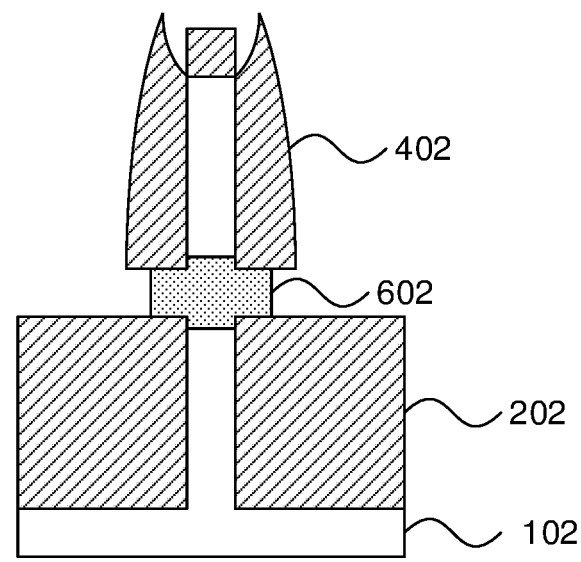
FIG. 6 is a cross-sectional diagram of a step in the formation of a semiconductor device having stacked top and bottom semiconductor fins at controllable respective heights, separated by an isolation layer of controllable thickness, in accordance with an embodiment of the present invention.

Referring now to FIG. 6, a cross-sectional diagram of a step in the formation of stacked fin devices with varying fin lengths and isolation thickness is shown. An oxidation process, such as thermal oxidation, is used to oxidize the exposed portion 502 of the semiconductor fin 104. This can be accomplished using a thermal oxidation process, which tends to oxidize faster laterally than it does vertically for bulk semiconductor substrates with a (100) crystal surface.

Additionally, in the case of silicon dioxide resulting from the oxidation of a silicon fin, the resulting silicon dioxide takes up more space than the original silicon did, causing the oxidized portion 602 to extend outward from the sidewalls of the fin 104. This oxidized portion 602 forms the isolation layer between an upper fin and a lower fin. The vertical thickness of the central part of the isolation layer 602 is determined by the length of time that the oxidation process is applied for and the temperature at which the thermal oxidation process is carried out, as such factors determine how much of the semiconductor material of the vertical fin is converted.

Figure 7:
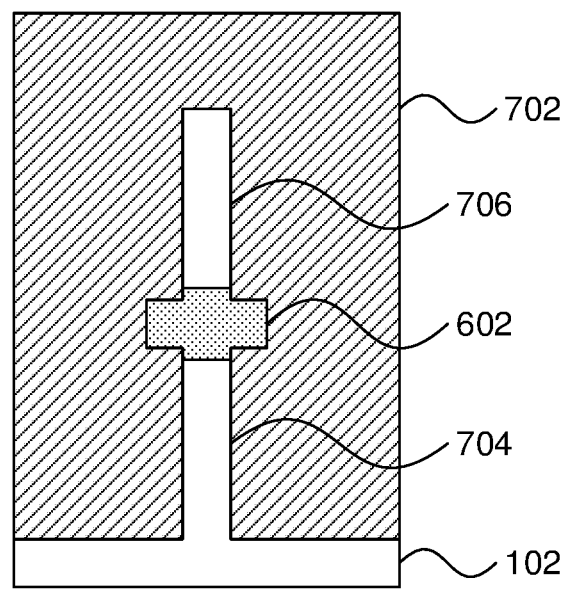
FIG. 7 is a cross-sectional diagram of a step in the formation of a semiconductor device having stacked top and bottom semiconductor fins at controllable respective heights, separated by an isolation layer of controllable thickness, in accordance with an embodiment of the present invention.

Referring now to FIG. 7, a cross-sectional diagram of a step in the formation of stacked fin devices with varying fin lengths and isolation thickness is shown. Additional dielectric material is deposited to form dielectric layer 702. It is specifically contemplated that the additional dielectric material can match the material of the dielectric layer 202, but it should be understood that other materials can be used instead. This dielectric layer 702 can be formed to protect the fins during subsequent processing steps. The isolation layer 602 is shown as separating the top fin 706 from the bottom fin 704.

Figure 8:
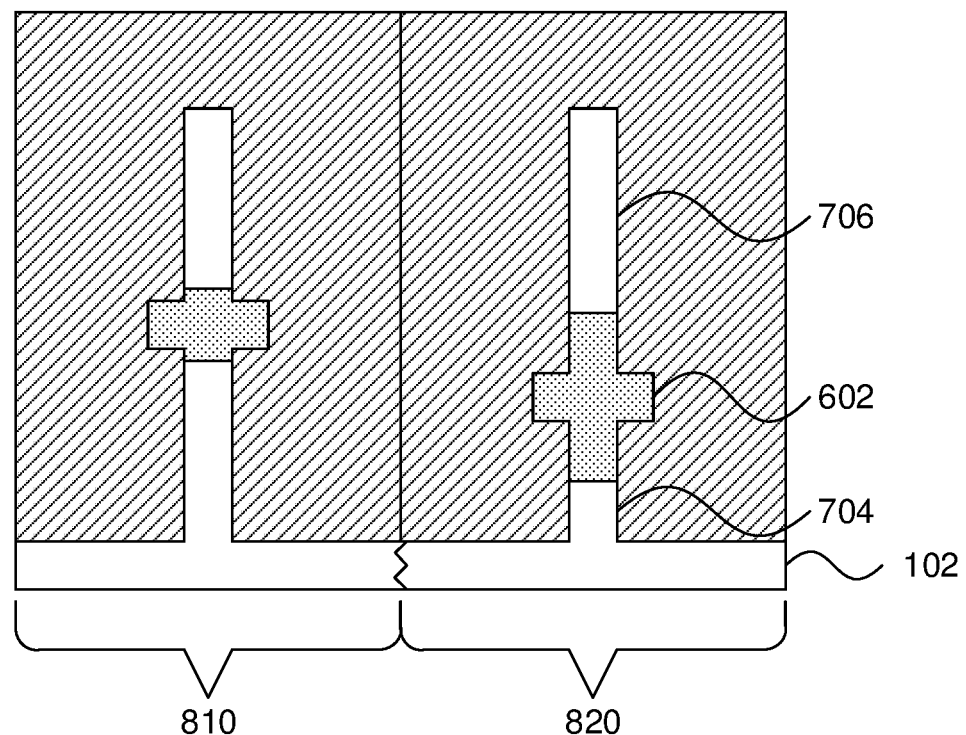
FIG. 8 is a cross-sectional diagram of a step in the formation of an integrated chip having at least two stacked fin semiconductor devices, each stacked fin semiconductor device having different fin heights and isolation layer thicknesses, in accordance with an embodiment of the present invention.

Referring now to FIG. 8, a cross-sectional diagram of a step in the formation of stacked fin devices with varying fin lengths and isolation thickness is shown. Two different devices regions are shown, including a first device region 810 and a second device region 820. These two device regions represent different regions of the chip or wafer and form devices that have different properties. In particular, the proportions between the heights of the top fin 706 and the bottom fin 704 in each region differ, as do the positions of the isolation layers 602. It should be understood that the regions 810 and 820 can differ in both of these respects, as shown, or can differ in only one of these respects (e.g., differing only in the relative heights of the top fin 706 and the bottom fin 704 or only in the thickness of the isolation layer 602).

It should be understood that different regions can be formed with different properties simply by masking the first region 810 while the isolation region 602 is formed in the second region 820 and then masking the second region 820 while the isolation region 602 is formed in the first region 810. Different values for the height h of the dielectric layer 202 can be used in the respective regions to set the proportion of heights between top and bottom fins. The position and thickness of the respective isolation regions 602 are determined by the height of the dielectric layer 202 and the length of the oxidation process in each of the regions.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
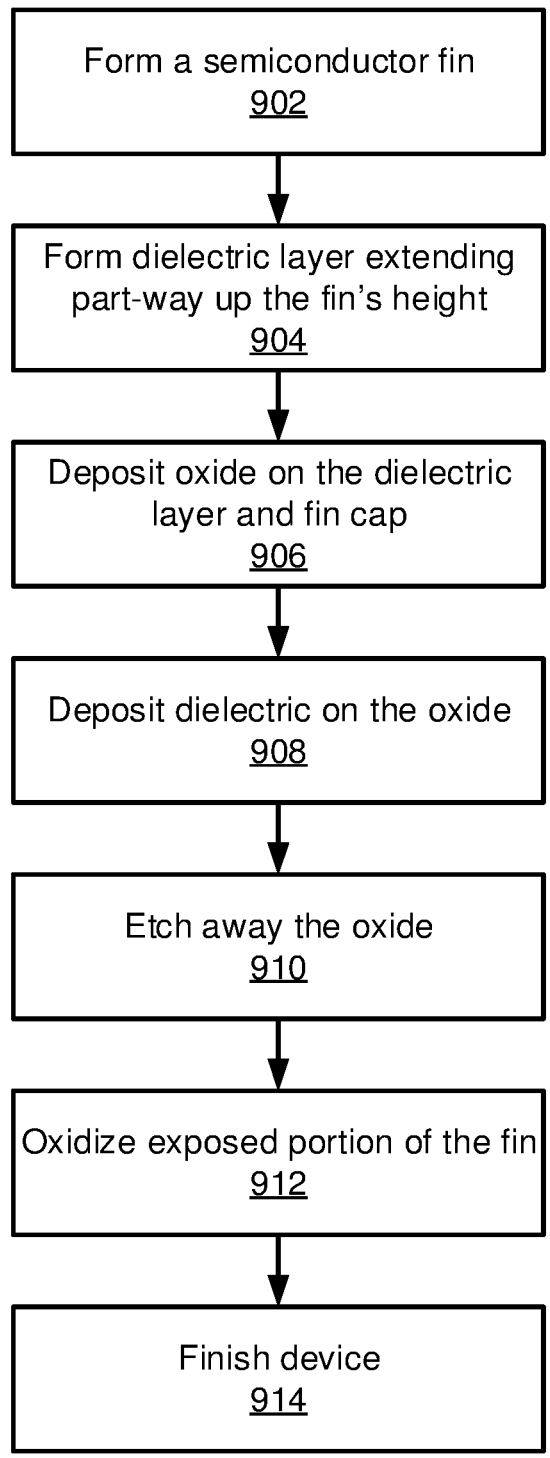
FIG. 9 is a block/flow diagram of a method of forming a semiconductor device having stacked top and bottom semiconductor fins at controllable respective heights, separated by an isolation layer of controllable thickness, in accordance with an embodiment of the present invention.

Referring now to FIG. 9, a process for forming stacked semiconductor fins is shown. Block 902 forms a semiconductor fin 104 from a semiconductor substrate using any appropriate anisotropic etch process, sidewall image transfer process, or any other appropriate process. The present embodiments show a fin cap that includes a dielectric material 106 (e.g., silicon nitride) and an oxide material 108. Block 904 forms a dielectric layer 202 that extends part of the way up the fin's height. The formation of the dielectric layer 202 can include a deposition that only adheres to the lower portion of the fin 104, the top portion of the fin being treated to inhibit deposition. The dielectric layer 202 can alternatively be formed using an etchback process, for example by depositing the dielectric material to height of the fin 104 or above and then etching back to create a dielectric layer 202 having the desired height.

Block 906 deposits oxide layers 302 and 304 using a conformal deposition that is inhibited from adhering to the sidewalls of the fin 104. The conformal deposition of block 906 can include, for example, CVD or ALD. Block 908 deposits dielectric material (e.g., silicon nitride) on oxide material 302 to create sidewall structures 402, including a conformal deposition, followed by an anisotropic etch that removes the dielectric material that is not protected by the oxide cap 304. Block 910 then selectively etches away the oxide material 302 and 304, leaving a gap that exposes a portion 502 of the semiconductor fin 104.

Block 912 then applies an oxidation process, such as thermal oxidation, to oxidize the exposed portion 502 of the semiconductor fin 104, creating the isolation layer 602. The vertical thickness of the oxidation layer 602 is determined, at least in part, by the length of time the oxidation process is applied for.

Block 914 finishes the semiconductor device once the stacked semiconductor fins 704 and 706 have been formed, separated by the isolation layer 602. It should be understood that this can include the fabrication of any appropriate semiconductor device, including, for example, VFETs, finFETs, fuses, etc. It is specifically contemplated that one of the top fin 706 and the bottom fin 704 can be formed as a p-type device and that the other fin can be formed as an n-type device, with appropriate dopant types being used to select the conductivity type. Other structures, such as a gate stack, source and drain regions, and contacts can also be formed as needed.

Figure 10:
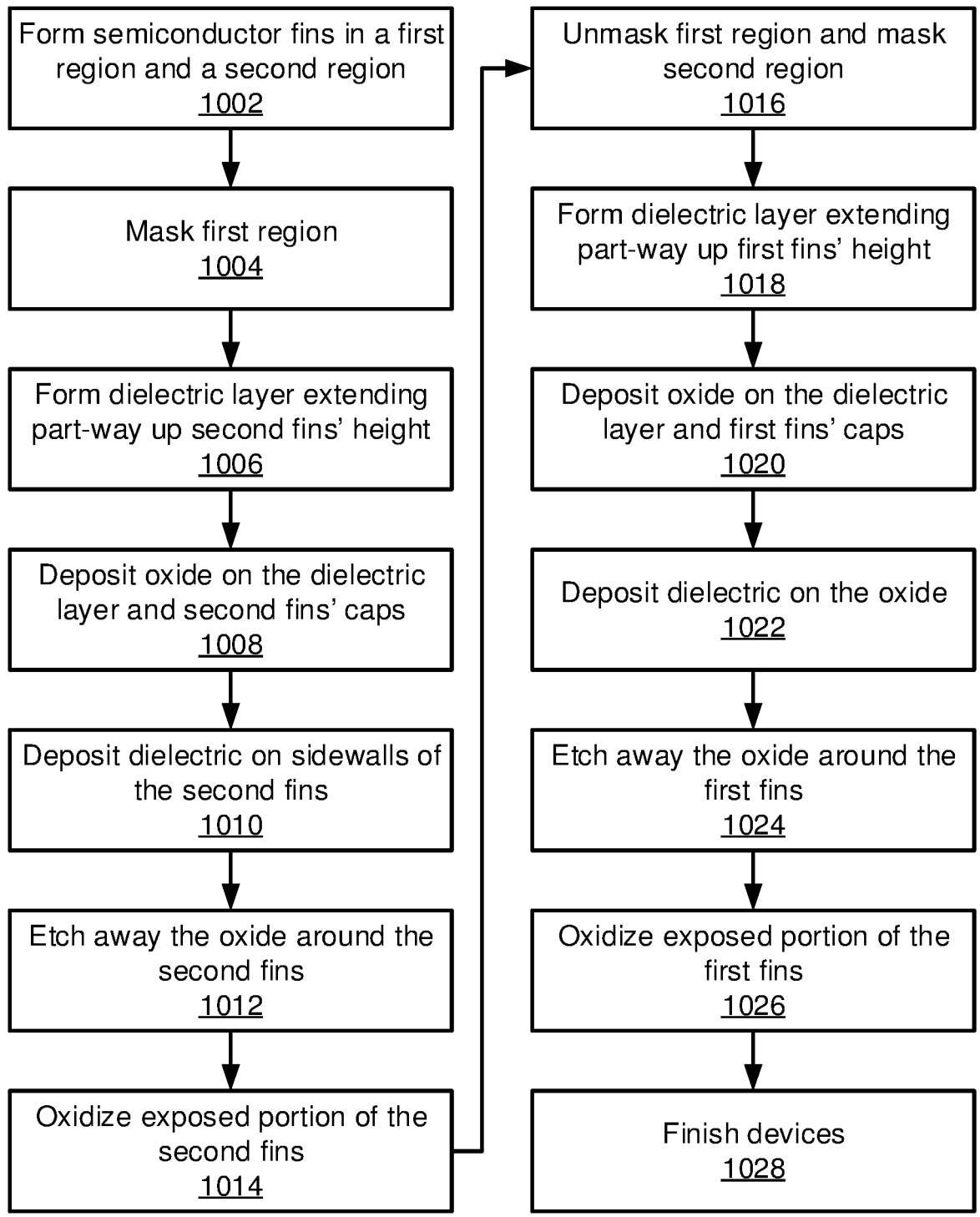
FIG. 10 is a block/flow diagram of a method of forming an integrated chip having at least two stacked fin semiconductor devices, each stacked fin semiconductor device having different fin heights and isolation layer thicknesses, in accordance with an embodiment of the present invention.

Referring now to FIG. 10, a process for forming stacked semiconductor fins having differing heights and thicknesses of the isolation layer between upper and lower fins is shown. Block 1002 forms one or more semiconductor fins 104 from a semiconductor substrate in a first region 810 and a second region 820 using any appropriate anisotropic etch process, sidewall image transfer process, or any other appropriate process. The fins may include a fin cap that includes a dielectric material 106 (e.g., silicon nitride) and an oxide material 108. It should be noted that more than two regions may also be used, with any number of fins belonging to each region. It should further be noted that a single region need not be contiguous, but may be positioned in disparate locations on a single chip/wafer, with the defining characteristics of each region being related to the relative size and separation of the stacked fins in the region.

Block 1004 masks the first region 810. Any appropriate masking process can be used. In some embodiments, the mask can include a dielectric layer and/or planarizing layer that protects the masked region while the other region is being processed. In alternative embodiments, the masking steps may be omitted by selectively forming the semiconductor fins 104 in each region, only forming the semiconductor fins 104 in a second region 820 after the stacked fins have been fully formed in the first region 810. In such alternative embodiments, the bulk of the semiconductor substrate 102 is effectively used as a mask.

Block 1006 forms a dielectric layer 202 that extends part of the way up the fins' height in the second region 820. The formation of the dielectric layer 202 can include a deposition that only adheres to the lower portion of the fins 104, the top portion of the fin being treated to inhibit deposition. The dielectric layer 202 can alternatively be formed using an etchback process, for example by depositing the dielectric material to height of the fins 104 or above and then etching back to create a dielectric layer 202 having the desired height.

Block 1008 deposits oxide material 302 and 304 using a conformal deposition that is inhibited from adhering to the sidewalls of the fins 104 in the second region 820. Block 1010 deposits dielectric material (e.g., silicon nitride) on sidewalls of the semiconductor fins 104 in the second region 820. Block 1010 includes a conformal deposition, followed by an anisotropic etch that removes the dielectric material that is not protected by the oxide cap 304 in the second region 820. Block 1012 then selectively etches away the oxide material 302 and 304, leaving a gap that exposes a portion 502 of the semiconductor fins 104.

Block 1014 then applies an oxidation process, such as thermal oxidation, to oxidize the exposed portion 502 of the semiconductor fin 104 in the second region 820, creating the isolation layer 602. The vertical thickness of the oxidation layer 602 is determined, at least in part, by the length of time the oxidation process is applied for. Thus, the isolation layer 602 in the second region 820 is determined by the height of the dielectric layer 202 in the second region 820 and the amount of time that this oxidation process is applied.

Block 1016 strips the mask on the first region 810 and forms a mask on the second region 820. In alternative embodiments, where the second region 820 was processed before fins were even formed in the first region 810, a mask is formed over the first region and the fins 104 are formed in the second region 820.

Block 1018 then forms a dielectric layer 202 in the first region 810. The dielectric layer 202 of the first region 810 can have the same height as the dielectric layer 202 of the second region 820 or may have a different height. It is specifically contemplated that the dielectric layers 202 in the respective device regions can have different heights to produce stacked fins that have different proportions between the top fins and bottom fins. As in block 1006, block 1018 can include a deposition that only adheres to the lower portion of the fins 104, the top portion of the fin being treated to inhibit deposition. Block 1018 can alternatively use an etchback process, for example by depositing the dielectric material to height of the fins 104 or above and then etching back to create a dielectric layer 202 having the desired height.

Block 1020 deposits oxide material 302 and 304 using a conformal deposition that is inhibited from adhering to the sidewalls of the fins 104 in the first region 810. Block 1022 deposits dielectric material (e.g., silicon nitride) on oxide material 302 in the second region 810. As with block 1010, block 1022 can include a conformal deposition, followed by an anisotropic etch that removes the dielectric material that is not protected by the oxide cap 304 in the first region 810. Block 1024 then selectively etches away the oxide material 302 and 304, leaving a gap that exposes a portion 502 of the semiconductor fins 104 in the first region 810.

Block 1026 then applies an oxidation process, such as thermal oxidation, to oxidize the exposed portion 502 of the semiconductor fin 104 in the first region 810, creating the isolation layer 602. As above, the vertical thickness of the oxidation layer 602 in the first region 810 is determined, at least in part, by the length of time the oxidation process is applied for. Thus, the isolation layer 602 in the first region 820 is determined by the height of the dielectric layer 202 in the second region 810 and the amount of time that this oxidation process is applied.

Block 1028 finishes the semiconductor devices once the stacked semiconductor fins 704 and 706 have been formed, separated by the isolation layer 602, in each of the first region 810 and the second region 820. As above, this finishing step can include the fabrication of any appropriate semiconductor device, including, for example, VFETs, finFETs, fuses, etc. It is specifically contemplated that one of the top fin 706 and the bottom fin 704 can be formed as a p-type device and that the other fin can be formed as an n-type device, with appropriate dopant types being used to select the conductivity type. Other structures, such as a gate stack, source and drain regions, and contacts can also be formed as needed.

Having described preferred embodiments of vertically stacked fin semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a bottom fin formed from a first semiconductor material;
a top fin formed from the first semiconductor material;
an isolation layer formed from an oxide of the first semiconductor material, directly between the bottom fin and the top fin, including a top portion and a bottom portion each having a first horizontal thickness in a first direction, and a middle portion, between the top portion and the bottom portion, having a second horizontal thickness in the first direction that is greater than the first horizontal thickness; and
a dielectric layer over and around the top fin, the bottom fin, and the isolation layer, formed from a dielectric material different from the oxide of the first semiconductor material.

2. The semiconductor device of claim 1, wherein the isolation layer has a cross-shaped cross-section.

3. The semiconductor device of claim 1, wherein a height of the top fin and a height of the bottom fin are unequal to one another.

4. The semiconductor device of claim 1, wherein a height of the top fin and a height of the bottom fin are equal to one another.

5. The semiconductor device of claim 1, wherein the top fin, the bottom fin, and the isolation layer are formed from a continuous semiconductor structure.

* * * * *